US008703523B1

(12) United States Patent
Biener et al.

(10) Patent No.: US 8,703,523 B1
(45) Date of Patent: Apr. 22, 2014

(54) NANOPOROUS CARBON TUNABLE RESISTOR/TRANSISTOR AND METHODS OF PRODUCTION THEREOF

(75) Inventors: Juergen Biener, San Leandro, CA (US); Theodore F. Baumann, Discovery Bay, CA (US); Subho Dasgupta, Eggenstein-Leopoldshafen (DE); Horst Hahn, Seeheim-Jugenheim (DE)

(73) Assignees: Lawrence Livermore National Security, LLC., Livermore, CA (US); Karlsruher Institut fur Technologie (KIT), Eggenstein-Leopoldshafen (DE)

( * ) Notice: Subject to any disclaimer, the term of this patent is extended or adjusted under 35 U.S.C. 154(b) by 15 days.

(21) Appl. No.: 13/311,468

(22) Filed: Dec. 5, 2011

Related U.S. Application Data

(60) Provisional application No. 61/419,988, filed on Dec. 6, 2010.

(51) Int. Cl.
  *H01L 21/00* (2006.01)
(52) U.S. Cl.
  USPC .................. 438/82; 438/49; 257/E21.005
(58) Field of Classification Search
  USPC ............... 204/450; 438/82, 49; 257/E21.04, 257/E21.005
  See application file for complete search history.

(56) References Cited

U.S. PATENT DOCUMENTS

| 4,385,274 | A | * | 5/1983 | Shimada et al. ............. 324/71.6 |
| 6,325,909 | B1 | | 12/2001 | Li et al. |
| 7,091,096 | B2 | | 8/2006 | Balasubramanian et al. |
| 7,205,699 | B1 | | 4/2007 | Liu et al. |
| 7,211,854 | B2 | | 5/2007 | Bertin et |
| 7,247,290 | B2 | | 7/2007 | Lobovsky et al. |
| 7,274,128 | B1 | | 9/2007 | Liu et al. |
| 7,305,839 | B2 | | 12/2007 | Weaver, Jr. |
| 7,399,400 | B2 | | 7/2008 | Soundarrajan et al. |

(Continued)

FOREIGN PATENT DOCUMENTS

| EP | 2 236 824 A2 | 10/2010 |
| WO | 01/57917 A3 | 8/2001 |

(Continued)

OTHER PUBLICATIONS

Pribat et al., "Lateral alumina templates for carbon nanotubes and semiconductor nanowires synthesis," 2005, M. Razeghi and G. J. Brown, Quantum Sensing and Nanophotonic Devices II, Proeedings of SPIE, vol. 5732, pp. 58-67.

(Continued)

*Primary Examiner* — Caridad Everhart
(74) *Attorney, Agent, or Firm* — Dominic M. Kotab

(57) ABSTRACT

In one embodiment, a tunable resistor/transistor includes a porous material that is electrically coupled between a source electrode and a drain electrode, wherein the porous material acts as an active channel, an electrolyte solution saturating the active channel, the electrolyte solution being adapted for altering an electrical resistance of the active channel based on an applied electrochemical potential, wherein the active channel comprises nanoporous carbon arranged in a three-dimensional structure. In another embodiment, a method for forming the tunable resistor/transistor includes forming a source electrode, forming a drain electrode, and forming a monolithic nanoporous carbon material that acts as an active channel and selectively couples the source electrode to the drain electrode electrically. In any embodiment, the electrolyte solution saturating the nanoporous carbon active channel is adapted for altering an electrical resistance of the nanoporous carbon active channel based on an applied electrochemical potential.

20 Claims, 7 Drawing Sheets

(56) References Cited

U.S. PATENT DOCUMENTS

| | | | |
|---|---|---|---|
| 7,709,880 | B2 | 5/2010 | Bertin et al. |
| 7,947,371 | B2 | 5/2011 | Boussaad et al. |
| 7,973,074 | B2 | 7/2011 | Demadrille et al. |
| 2001/0023986 | A1 | 9/2001 | Mancevski |
| 2002/0127171 | A1 | 9/2002 | Smalley et al. |
| 2005/0063244 | A1 | 3/2005 | Bertin et al. |
| 2005/0103706 | A1 | 5/2005 | Bennett et al. |
| 2006/0021881 | A1 | 2/2006 | Soundarrajan et al. |
| 2006/0024871 | A1 | 2/2006 | Balasubramanian et al. |
| 2006/0138896 | A1 | 6/2006 | Makansi |
| 2006/0240238 | A1 | 10/2006 | Boussaad et al. |
| 2008/0024902 | A1 | 1/2008 | Slafer |
| 2008/0079027 | A1 | 4/2008 | Bertin et al. |
| 2009/0021106 | A1 | 1/2009 | Baughman et al. |
| 2009/0269667 | A1* | 10/2009 | Antonietti et al. ......... 429/231.4 |
| 2009/0272967 | A1 | 11/2009 | Afzali-Ardakani et al. |
| 2009/0278556 | A1 | 11/2009 | Man et al. |
| 2009/0315631 | A1 | 12/2009 | Ham et al. |
| 2010/0084631 | A1 | 4/2010 | Boland et al. |
| 2010/0230298 | A1 | 9/2010 | Biener et al. |
| 2010/0261058 | A1 | 10/2010 | Lopatin et al. |
| 2010/0261071 | A1 | 10/2010 | Lopatin et al. |
| 2010/0268312 | A1 | 10/2010 | Wallace et al. |
| 2010/0310933 | A1* | 12/2010 | Jiang et al. ............ 429/188 |
| 2011/0002086 | A1* | 1/2011 | Feaver et al. ............... 361/502 |
| 2011/0068290 | A1* | 3/2011 | Haddon et al. ......... 252/62.51 R |
| 2011/0163296 | A1* | 7/2011 | Pace et al. .................. 257/24 |
| 2012/0026643 | A1* | 2/2012 | Yu et al. ..................... 361/502 |
| 2012/0115295 | A1* | 5/2012 | Lin et al. .................... 438/268 |

FOREIGN PATENT DOCUMENTS

| | | | |
|---|---|---|---|
| WO | 02/055769 | A1 | 7/2002 |
| WO | 2005/034204 | A2 | 4/2005 |
| WO | 2005/084378 | A2 | 9/2005 |
| WO | 2006/138263 | A2 | 12/2006 |
| WO | 2007/103832 | A2 | 9/2007 |
| WO | 2007/114140 | A1 | 10/2007 |
| WO | 2009/132894 | A1 | 11/2009 |
| WO | 2010/019942 | A2 | 2/2010 |
| WO | 2010/120813 | A2 | 10/2010 |
| WO | 2010/120995 | A1 | 10/2010 |
| WO | 2011/005375 | A2 | 1/2011 |

OTHER PUBLICATIONS

Rahman et al., "Enhanced lithium storage in a VO(2)(B)-multiwall carbon nanotube microsheet composite prepared via an in situ hydrothermal process," 2010 Elsevier Ltd., Electrochimica Acta, vol. 56, pp. 693-699.

Rangaraju et al., "Low-cost photoelectrocatalyst based on a nanoporous oxide layer of low-carbon steel," 2010 IOP Publishing Ltd., Journal of Physics D: Applied Physics, vol. 43, pp. 1-8.

Teng et al., "Performance of electric double-layer capacitors using carbons prepared from phenol-formaldehyde resins by KOH etching," 2001 Elsevier Science Ltd., Carbon, vol. 39, pp. 1981-1987.

Torop et al., "Flexible supercapacitor-like actuator with carbide-derived carbon electrodes," 2001, Carbon, vol. 49, No. 9, pp. 3113-3119, Abstract Only.

Wang et al., "Nonenzymatic Electrochemical Glucose Sensor Based on Nanoporous PtPb Networks," 2008 American Chemical Society, Analytical Chemistry, vol. 80, No. 4, Feb. 15, 2008, pp. 997-1004.

Wu et al., "Electrochemical fabrication and capacitance of composite films of carbon nanotubes and polyaniline," 2005 The Royal Society of Chemistry, Journal of Materials Chemistry, No. 15, pp. 2297-2303.

Wu et al., "Investigation the addition of silicon oxide to carbon: Effects of amount and heat treatment on anti-aggregation and electrochemical performance of Pt catalysts," 2010 Elsevier B.V., Journal of Power Sources, vol. 196, pp. 1112-1117.

Lu-Ping et al., "Preparation of Functionalized Graphene Sheets via Microwave-Assisted Solid-State Process and Their Electrochemical Capacitive Behaviors," 2010 Chinese Journal of Inorganic Chemistry, vol. 26, No. 8, pp. 1375-1381.

Yoon et al., "Direct template synthesis of mesoporous carbon and its application to supercapacitor electrodes," 2009 Elsevier Ltd., Materials Research Bulletin, vol. 44, pp. 1663-1669.

Vanmaekelbergh et al., "Electrochemical gating: A method to tune and monitor the (opto) electronic properties of functional materials," 2007 Elsevier Ltd., Electrochimica Acta, vol. 53, pp. 1140-1149.

Wang et al., "Graphene Aerogels," 2009 The Electrochemical Society, ECS Transactions, vol. 19, No. 5, pp. 241-247.

Wei et al., "A novel electrode material for electric double-layer capacitors," 2004 Elsevier B.V., Journal of Power Sources 2005, vol. 141, pp. 386-391.

Yu et al., "Nanoporous carbon nanotube electrode for stable polypyrrole actuator ," Electroactive Polymer Actuators and Devices (EAPAD) 2007, Proc. of SPIE, vol. 6524, pp. 652420/1-652420/9.

Choi et al., "Surface selective polymerization of polypyrrole on ordered mesoporous carbon: Enhancing interfacial conductivity for direct methanol fuel cell application," 2006 American Chemical Society, Macromolecules 2006, vol. 39, pp. 3275-3282.

Fang et al., "Modified carbon materials for high-rate EDLCs application," 2005 Elsevier B.V., Journal of Power Sources, vol. 155, pp. 487-491.

Fletcher et al., "Actuatable membranes based on polypyrrole-coated vertically aligned carbon nanofibers," 2008 American Chemical Society, ACSNano, vol. 2, No. 2, pp. 247-254.

Janes et al., "Electrochemical characteristics of nanoporous carbide-derived carbon materials in various nonaqueous electrolyte solutions," 2006 The Electrochemical Society, Inc., Journal of the Electrochemical Society, vol. 153, No. 1, pp. A113-A116.

Arulepp et al., "The advanced carbide-derived carbon based supercapacitor," 2006 Elsevier B.V., Journal of Power Sources, vol. 162, pp. 1460-1466.

Janes et al., Electrochemical characteristics of nanoporous carbide-derived carbon materials in non-aqueous electrolyte solutions, 2004 Elsevier B.V., Electrochemistry Communications, vol. 6, pp. 313-318.

Jin et al., "Sign-inverted surface stress-charge response in nanoporous gold," 2008 Elsevier B.V., Surface Science, vol. 602, pp. 3588-3594.

Jin et al., "Electrochemical properties of carbon aerogels derived from resorcinol-formaldehyde-aniline for supercapacitors," 2011 Emerald Group Publishing Limited, Pigment & Resin Technology, vol. 40, No. 3, pp. 175-180.

Li et al., "Structure and electrochemical properties of carbon aerogels synthesized at ambient temperatures as supercapacitors," 2007 Elsevier B.V., Journal of Non-Crystalline Solids, vol. 354, pp. 19-24.

Liu et al., "Carbon aerogel spheres prepared via alcohol supercritical drying," 2006 Elsevier Ltd., Carbon, vol. 44, pp. 2430-2436.

Lowy et al., "Nonobatteries: Decreasing Size Power Sources for Growing Technologies," 2008 Bentham Science Publishers Ltd., Recent Patents on Nanotechnology, vol. 2, pp. 208-219.

Lust et al., "Influence of electrolyte characteristics on the electrochemical parameters of electrical double layer capacitors," 2004 Springer-Verlag, J. Solid State Eelctrochem, vol. 8, pp. 488-496.

Mulik et al., "Macroporous Electrically Conducting Carbon Networks by Pyrolysis of Isocyanate-Cross-Linked Resorcinol-Formaldehyde Aerogels," 2008 American Chemical Society, Chem. Mater, vol. 20, pp. 6985-6997.

Palmre et al., "Electroactive polymer actuators with carbon aerogel electrodes," 2011 The Royal Society of Chemistry, J. Mater. Chem., vol. 21, pp. 2577-2583.

Permann et al., "Electrical double layer characteristics of nanoporous carbon derived from titanium carbide," 2005 Elsevier Ltd., Electrochimica Acta, vol. 51, pp. 1274-1281.

Bjornbom, Pehr, "Charge/discharge of an electrochemical supercapacitor electrode pore; non-uniqueness of mathematical models," 2006 Elsevier B.V., Electrochemistry Communications, vol. 9, pp. 211-215.

Branzoi et al., "Modified Electrodes Obtained by Electrochemical Codeposition of Some Conducting Polymers and Carbon Nanotubes," Journal: Revue Roumaine De Chimie 2011, vol. 56, No. 1, pp. 73-84.

(56) References Cited

OTHER PUBLICATIONS

Brogioli et al., "A prototype cell for extracting energy from a water salinity difference by means of double layer expansion in nanoporous carbon electrodes," 2011 The Royal Society of Chemistry, Energy Environ. Sci, vol. 4, pp. 772-777.

Sun et al., "New concept of in situ carbide-derived carbon/xerogel nanocomposite materials for electrochemical capacitor," 2011 Elsevier B.V., Materials Letters, vol. 65, pp. 1392-1395.

Tonurist et al., "Influence of Mesoporous Separator Properties on the Parameters of Electrical Double-Layer Capacitor Single Cells," 2009 The Electrochemical Society, Journal of the Electrochemical Society, vol. 156, No. 4, pp. A334-A342.

Torop et al., "Flexible supercapacitor-like actuator with carbide-derived carbon electrodes," 2011 Elsevier Ltd., Carbon, vol. 49, pp. 3113-3119.

Fang et al., "Surface modification of carbonaceous materials for EDLCs application," 2005 Elsevier Ltd., Electrochimica Acta, vol. 50, pp. 3616-3621.

Fang et al., "A novel carbon electrode material for highly improved EDLC performance," 2006 American Chemical Society, J. Phys. Chem. B., vol. 110, pp. 7877-7882.

Fang et al., "Influence of hydrophobisation of carbon surface on electrochemical capacitor performance," 2007 Elsevier B.V., Journal of Electroanalytical Chemistry, vol. 609, pp. 99-104.

Fischer et al., "Electroless deposition of nanoscale $MnO_2$ on ultraporous carbon nanoarchitectures: Correlation of evolving pore-solid structure and electrochemical performance," 2008 The Electrochemical Society, Journal of the Electrochemical Society, vol. 155, No. 3, pp. A246-A252.

Gajendran et al., "Polyaniline-carbon nanotube composites," 2008 IUPAC, Pure Appl. Chem., vol. 80, No. 11, pp. 2377-2395.

Han et al., "Novel route to pure and composite fibers of polypyrrole," 2006 Wiley Periodicals, Inc., Journal of Applied Polymer Science, vol. 103, pp. 1490-1494.

Hinds et al., "Aligned multiwalled carbon nanotube membranes," Jan. 2, 2004, Science, vol. 303, pp. 62-65.

Honda et al., "Electrochemical properties of Pt-modified nano-honeycomb diamond electrodes," 2001 Elsevier Science B.V., Journal of Electroanalytical Chemistry, vol. 514, pp. 35-50.

Hughes et al., "The effect of nanotube loading and dispersion on the three-dimensional nanostructure of carbon nanotube-conducting polymer composite films," 2003 Materials Research Society, Mat. Res. Soc. Symp. Proc., vol. 739, pp. 211-216.

Itoh et al., "Fuel Cell-related Reaction Activities of Nanoporous Metallic Platinum," 2010 Adsorption Science & Technology, vol. 28, No. 1, pp. 39-47.

Janes et al., "Organic carbonate-organic ester-based non-aqueous electrolytes for electrical double layer capacitors," 2005 Elsevier B.V., Electrochemistry Communications, vol. 7, pp. 510-514.

Janes et al., "Voltammetric and electrochemical impedance spectroscopy studies of the nanoporous carbon/1 M $(C_2H_5)(3)CH_3NBF_4$ electrolyte solution interface," 2004 Elsevier B.V., Journal of Electroanalytical Chemistry, vol. 569, pp. 257-269.

Janes et al., "Influence of solvent nature on the electrochemical characteristics of nanoporous carbon/1 M $(C_2H_5)(3)$ $CH_3NBF_4$ electrolyte solution interface," 2004 Elsevier B.V., Surface Science, vol. 560, pp. 145-157.

Jang et al., "Electrochemical capacitor performance of hydrous ruthenium oxide/mesoporous carbon composite electrodes," 2003 Elsevier Science B.V., Journal of Power Sources, vol. 123, pp. 79-85.

Jin et al., "Stable support based on highly graphitic carbon xerogel for proton exchange membrane fuel cells," 2010 Elsevier B.V., Journal of Power Sources, vol. 195, pp. 6323-6328.

Kim et al., "Electrical, magnetic, and optical properties of pi-conjugated polymer nanotubes and nanowires," 2004 World Scientific Publishing Company, Journal of Nonlinear Optical Physics & Materials, vol. 13, Nos. 3 & 4, pp. 547-551.

Kim et al., "The Role of Metallic Fe and Carbon Matrix in $Fe(2)O(3)$/Fe/Carbon Nanocomposite for Lithium-Ion Batteries," 2010 The Electrochemical Society, Journal of the Electrochemical Society, vol. 157, vol. 4, pp. A412-A417.

Li et al., "Pore characteristics and electrochemical performance of ordered mesoporous carbons for electric double-layer capacitors," 2006 Elsevier Ltd., Electrochimica Acta, vol. 51, pp. 5715-5720.

Liu et al., "Carbon xerogels as Pt catalyst supports for polymer electrolyte membrane fuel-cell applications," 2009 Elsevier B.V., Journal of Power Sources, vol. 195, pp. 1812-1820.

Liu et al., "Enhanced electrochemical hydrogen storage capacity of activated mesoporous carbon materials containing nickel inclusions," 2010 Elsevier Ltd., International Journal of Hydrogen Energy, vol. 35, pp. 12410-12420.

Xi-Miao et al., "Impedance of carbon aerogel/activated carbon composites as electrodes of electrochemical capacitors in aprotic electrolyte," Jun. 2007, Elsevier Limited, ScienceDirect, New Carbon Materials, vol. 22, Issue 2, pp. 153-158.

Majumder et al., "Towards mimicking natural protein channels with aligned carbon nanotube membranes for active drug delivery," 2009 Elsevier Inc., Life Sciences, vol. 86, pp. 563-568.

Nam et al., "Pseudocapacitive properties of electrochemically prepared nickel oxides on 3-dimensional carbon nanotube film substrates," 2008 Elsevier B.V., Journal of Power Sources, vol. 182, pp. 642-652.

Petrova et al., "Synthesis of nanoporous carbons from mixtures of coal tar pitch and furfural and their application as electrode materials," 2010 Elsevier B.V., Fuel Processing Technology, vol. 91, pp. 1710-1716.

Dasgupta et al., "Electric field induced reversible tunign of resistance of thin gold films," Journal of Applied Physics, vol. 104, Issue 10, Nov. 2008, pp. 103707-103707-5, abstract only.

Wang et al., "N-Doping of graphene through electrothermal reactions with ammonia," Science, vol. 324, May 8, 2009, pp. 768-771, abstract only.

Baumann et al., "High surface area carbon aerogel monoliths with hierarchical porosity," Journal of Non-Crystalline Solids, vol. 354, Issue 29, Jul. 1, 2008, pp. 3513-3515, abstract only.

Dasgupta, S., "Tuneable electron transport in metallic nanostructures," PhD Dissertation, Oct. 2009, Institute for Nanotechnology, pp. 1-143 (non-translated).

Dasgupta et al., "A nanoparticulate indium tin oxide field-effect transistor with solid electrolyte gating," Nanotechnology, 2008, vol. 19, No. 43, abstract only.

Dasgupta et al., "Electron mobility variations in surface-charged indium tin oxide thin films," Phys. Rev. B., vol. 80, 2009, 8 pages, abstract only.

Carpi et al., "Electroactive Polymer Actuators: From Lab to Market," 12th International Conference on New Actuators/ 6th International Exhibition on Smart Actuators and Drive Systems, Jun. 14-16, 2010, 1 page.

Chu et al., "Fabrication of $TiO_2$—Ru—$(Qi2)$/$Al_2O_3$ composite nanostructures on glass by Al anodization and electrodeposition," Journal of the Electrochemical Society, vol. 151, No. 1, pp. C38-C44, abstract only, (2004).

Mirzaeian et al., "Characterizing capacity loss of lithium oxygen batteries by impedance spectroscopy," Journal of Power Sources, vol. 195, No. 19, pp. 6817-6824, abstract only, (2010).

Weng et al., "Characterization of high porosity carbon electrodes derived from mesophase pitch for electric double-layer capacitors," Journal of the Electrochemical Society, vol. 148, No. 4, 2001, pp. A368-A373.

Wu et al., "Investigation on properties of $V_2O_5$-MWCNTs composites as cathode materials," Journal of βol—Gel Science and Technology, vol. 46, Issue 1, pp. 79-85, abstract only, (Apr. 2008).

\* cited by examiner

NANOPOROUS CARBON TUNABLE RESISTOR/TRANSISTOR AND METHODS OF PRODUCTION THEREOF

RELATED APPLICATION

This application claims priority to U.S. Provisional Patent Appl. No. 61/419,988, filed Dec. 6, 2010, which is herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to an electrochemically controlled tunable resistor/transistor, and more particularly, to a nanoporous carbon tunable resistor/transistor.

BACKGROUND

It is known that the resistance of a thin metal film can be reversibly tuned via the application of an external charge in an electrolyte where the Helmholtz double layer is utilized as the gate electrode. In this context, the idea of an electrochemically gated all-metal device is related to the well known field-effect transistor (FET), where the electronic transport through a semiconductor channel is controlled by an external gate potential.

However, the effect, i.e., the change in resistance ($\Delta R/R$) is only about 1-2% in the case of a pure metal due to a very large intrinsic carrier density and very short screening length resulting from the very large intrinsic carrier density. This restricts the selection of the pure metal to materials that are stable in an electrochemical environment, which are inert, noble metals and are extremely expensive and heavy. The size of the surface charge induced variation during electronic transport in a metallic conducting material increases with an increase in surface-to-volume ratio. However, most metallic materials with very high surface-to-volume ratio, such as de-alloyed metals, are not thermodynamically stable. Any supply of external energy thus reduces the surface area and the size of surface related effects. Accordingly, a material which could be used in these electrochemical environments and remain stable and do not suffer from the deficiencies of inert, noble metals would be very beneficial.

SUMMARY

In one embodiment, a tunable transistor includes a porous material that is electrically coupled between a source electrode and a drain electrode, wherein the porous material acts as an active channel, an electrolyte solution saturating the active channel, the electrolyte solution being adapted for altering an electrical resistance of the active channel based on an applied electrochemical potential, wherein the active channel comprises nanoporous carbon arranged in a three-dimensional structure.

In another embodiment, a method for forming a tunable transistor includes forming a source electrode, forming a drain electrode, and forming a monolithic nanoporous carbon material that acts as an active channel and selectively couples the source electrode to the drain electrode electrically.

According to another embodiment, a method for tuning a tunable resistor/transistor includes altering an electrical resistance of a nanoporous carbon active channel by altering an applied electrochemical potential of an electrolyte, wherein the electrolyte saturates the nanoporous carbon active channel, and the nanoporous carbon active channel is selectively coupled to a source electrode and a drain electrode electrically.

In yet another embodiment, a tunable resistor/transistor includes a nanoporous carbon active channel electrically coupled between a source electrode and a drain electrode, the nanoporous carbon active channel having a monolithic three-dimensional structure such as a carbon aerogel, and an electrolyte solution saturating the nanoporous carbon active channel, the electrolyte solution being adapted for altering an electrical resistance of the nanoporous carbon active channel based on an applied electrochemical potential, wherein the carbon aerogel is doped with an element selected from nitrogen, oxygen, fluorine, and boron, the carbon aerogel has a surface area of greater than about 3000 m$^2$/g, the electrolyte solution is an ionic liquid including at least one of: 1-Ethyl-3-methylimidazolium tetiafluoroborate (EMIMBF$_4$), 1-Butyl-3-methylimidazolium hexafluorophosphate (BMIMPF$_6$), and trioctylmethylammonium bis(trifluoromethyl-sulfonyl) imide or an aqueous or nonaqueous electrolyte solution including at least one of: LiF, NaF, KF, KOH, KCl, H$_2$SO$_4$, HClO$_4$, LiClO$_4$, NaClO$_4$, Et$_4$NPF$_6$, Et$_4$NBF$_4$, Bt$_4$NPF$_6$, and Bt$_4$NBF$_4$.

Other aspects and embodiments of the present invention will become apparent from the following detailed description, which, when taken in conjunction with the drawings, illustrate by way of example the principles of the invention.

DETAILED DESCRIPTION

Figure 1:
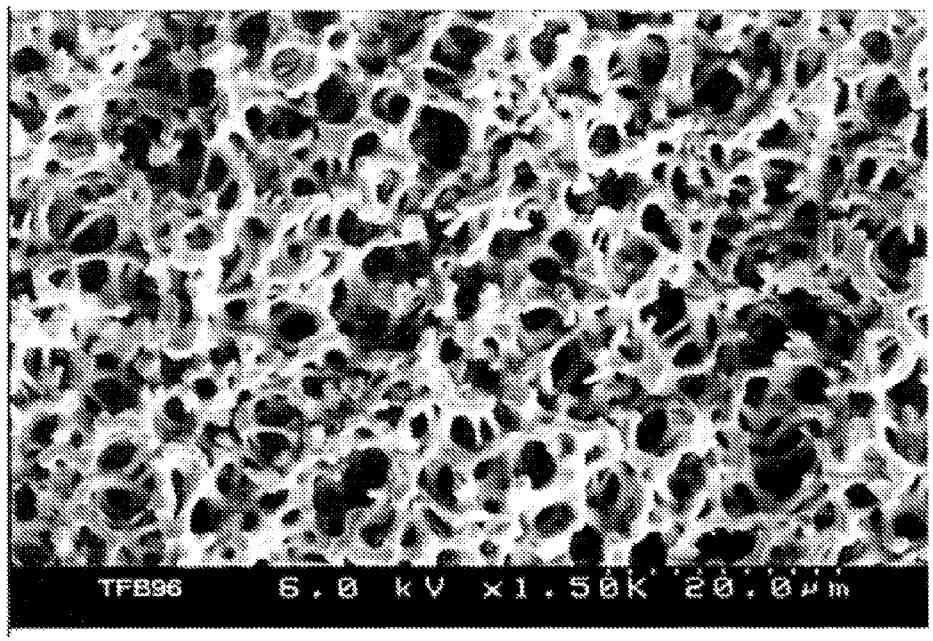
FIG. 1 shows morphology characteristic of a carbon aerogel, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a tunable transistor includes a porous material that is electrically coupled between a source electrode and a drain electrode, wherein the porous material acts as an active channel, an electrolyte solution saturating the active channel, the electrolyte solution being adapted for altering an electrical resistance of the active channel based on an applied electrochemical potential, wherein the active channel comprises nanoporous carbon arranged in a three-dimensional structure.

In another general embodiment, a method for forming a tunable transistor includes forming a source electrode, forming a drain electrode, and forming a monolithic nanoporous carbon material that acts as an active channel and selectively couples the source electrode to the drain electrode electrically.

According to another general embodiment, a method for tuning a tunable resistor/transistor includes altering an electrical resistance of a nanoporous carbon active channel by altering an applied electrochemical potential of an electrolyte, wherein the electrolyte saturates the nanoporous carbon active channel, and the nanoporous carbon active channel is selectively coupled to a source electrode and a drain electrode electrically.

In yet another general embodiment, a tunable resistor/transistor includes a nanoporous carbon active channel electrically coupled between a source electrode and a drain electrode, the nanoporous carbon active channel having a monolithic three-dimensional structure including a carbon aerogel, and an electrolyte solution saturating the nanoporous carbon active channel, the electrolyte solution being adapted for altering an electrical resistance of the nanoporous carbon active channel based on an applied electrochemical potential, wherein the carbon aerogel is doped with an element selected from nitrogen, oxygen, fluorine, and boron, the carbon aerogel has a surface area of greater than about 3000 $m^2/g$, the electrolyte solution is an ionic liquid including at least one of: 1-Ethyl-3-methylimidazolium tetrafluoroborate (EMIMBF$_4$), 1-Butyl-3-methylimidazolium hexafluorophosphate (BMIMPF$_6$), and trioctylmethylammonium bis(trifluoromethyl-sulfonyl)imide or an aqueous or nonaqueous electrolyte solution including at least one of: LiF, NaF, KF, KOH, KCl, $H_2SO_4$, $HClO_4$, $LiClO_4$, $NaClO_4$, $Et_4NPF_6$, $Et_4NBF_4$, $Bt_4NPF_6$, and $Bt_4NBF_4$.

According to one embodiment, an electrochemically controlled tunable resistor/transistor is based on a bulk nanoporous carbon material with extreme surface area and electrochemical addressing of the surfaces to control the density and nature of charge carriers. The intrinsic two dimensional morphology of sp$^2$ hybridized graphene sheets that are a major constituent of highly activated carbon aerogels stabilizes this material although it has an extremely high (greater than about 3000 $m^2/g$) surface-to-volume ratio.

Furthermore, according to some embodiments, the electrochemically controlled tunable resistor/transistor based on the nanoporous carbon material may have a three dimensional (3D) structure, and may be made to form monolithic 3D bodies. The nanoporous carbon is highly conductive due to its graphitic nature and its continuous ligament morphology. Specifically, carbon aerogels with extremely high mass-specific surface area (about 3000 $m^2/g$, more or less) may be used as the nanoporous carbon in some embodiments.

Carbon aerogels (CAs) are mesoporous materials which combine many interesting properties, such as low mass densities, continuous porosities, high surface areas, high electrical conductivities, and excellent mechanical properties. The properties of carbon aerogels are derived from their microstructure, which is a network of interconnected primary particles with characteristic diameters between about 3 to 25 nm, in some approaches. The material forms macroscopic (for instance, centimeter-sized) monolithic bodies that can support high electrical currents.

FIG. 1 shows morphology characteristic of a carbon aerogel before activation in $CO_2$ at about 950° C., according to one embodiment. This is just an example of the morphology of a typical carbon aerogel, and any morphology resulting from the embodiments and approaches described herein may be used, as would be understood by one of skill in the art upon reading the present descriptions.

The material may be synthesized through sol-gel polymerization of resorcinol with formaldehyde in aqueous solution to produce organic gels which may be supercritically dried and subsequently pyrolyzed in an inert atmosphere, in one approach. The material may also be activated to increase the mass specific surface area, for example in $CO_2$ at about 950° C. The resulting material has macropores to facilitate mass transport, and micropores which provide a high surface area.

Figure 2:
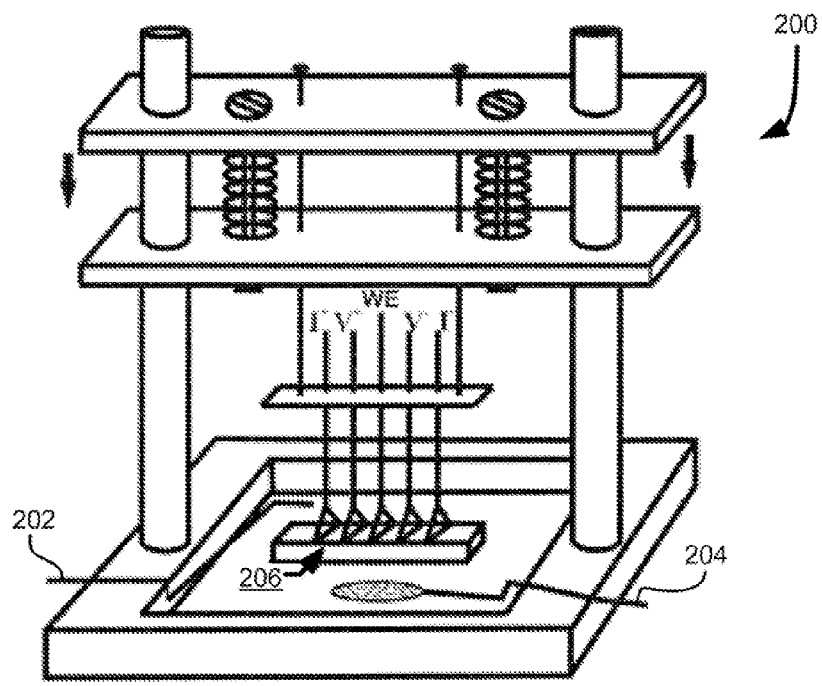
FIG. 2 shows an experimental setup that includes a miniaturized electrochemical cell, according to one embodiment.

The electrical resistance of carbon aerogel materials was tested in an experimental setup that included a miniaturized electrochemical cell that allows performing four point probe electrical I/V measurements on the nanoporous carbon working electrode as a function of the applied electrochemical potential. As shown in FIG. 2, this electrochemical cell 200 includes a reference electrode 202, a counter electrode 204, and the carbon aerogel 206 for testing. In one embodiment, the reference electrode 202 may include silver and/or silver chloride (Ag/AgCl). The counter electrode 204, in one approach, may comprise nanoporus carbon or amorphous carbon (kynol). Of course, any suitable material may be used for the reference electrode 202 and counter electrode 204 as would be apparent to one of skill in the art upon reading the present descriptions.

Similar to a field effect transistor (FET), both the density and the nature of the charge carriers in the CA electrode may be controlled through the electrochemical double layer. Aqueous, nonaqueous, and/or ionic electrolytes may be used. Aqueous electrolytes may include salt solutions in water such as LiF, NaF, KF, KOH, KCl, $H_2SO_4$, $HClO_4$, $LiClO_4$, $NaClO_4$, $Et_4NPF_6$ (tetraethylammonium hexafluorophosphate), $Et_4NBF_4$, $Bt_4NPF_6$ (tetrabutylammonium hexafluorophosphate), $Bt_4NBF_4$, etc. Nonaqueous electrolytes may include any of acetonitrile, ethylene carbonate (EC), propylene carbonate (PC), dimethyl carbonate (DMC), ethyl acetate (EA), n-methyl formrmide (NMF), dimethyl formamide (DMF), dimethyl sulfoxide (DMSO) in a supporting electrolyte, such as LiF, NaF, $HClO_4$, $LiClO_4$, $NaClO_4$, $Et_4NPF_6$, $Et_4NBF_4$, $Bt_4NPF_6$, $Bt_4NBF_4$, etc. Ionic electrolytes include 1-Ethyl-3-methylimidazolium tetrafluoroborate (EMIMBF$_4$), 1-Butyl-3-methylimidazolium hexafluorophosphate (BMIMPF$_6$), trioctylmethylammonium bis(trifluoromethyl-sulfonyl)imide, etc.

The electrochemical cell 200 that was used for the surface charged induced change in resistance measurement included gold electrodes that were used to have pressure contact to the CA sample 206. Four contacts were used for four probe resistance measurements (I$^+$, V$^+$, V$^-$, I$^-$) and the fifth contact was connected to the working electrode WE which is the nanoporous carbon active channel that is electrically coupled between a source electrode and a drain electrode. The capacitive window of the CA sample/electrolyte combination was determined by cyclic voltammetry.

Figure 3A:
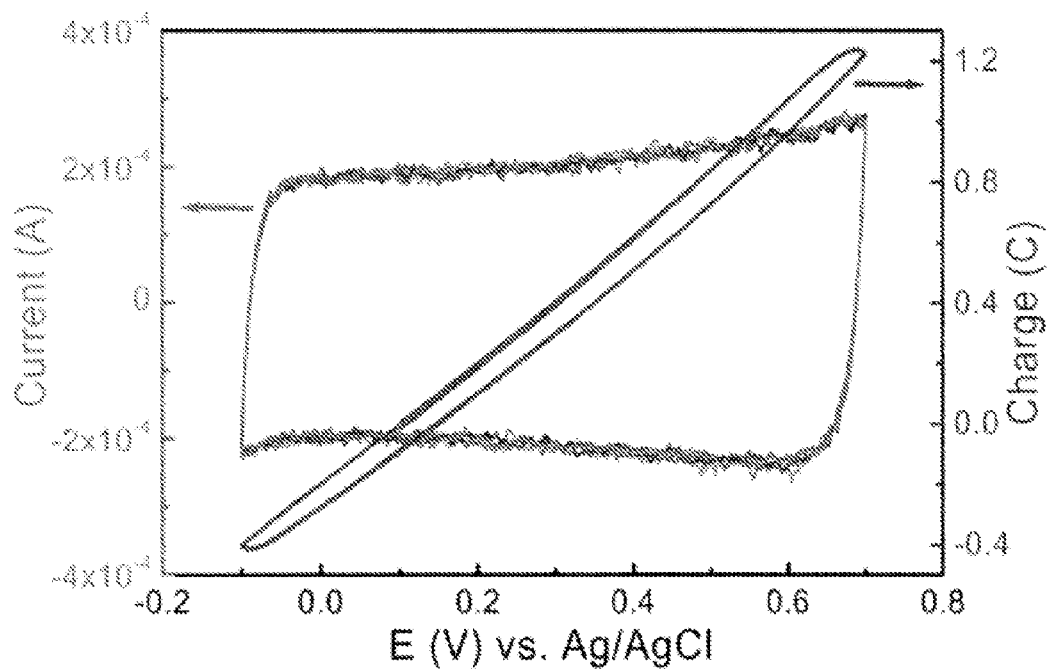
FIGS. 3A-3B show cyclovoltammograms obtained from activated carbon aerogels with different surface areas, according to one embodiment.
Figure 3B:
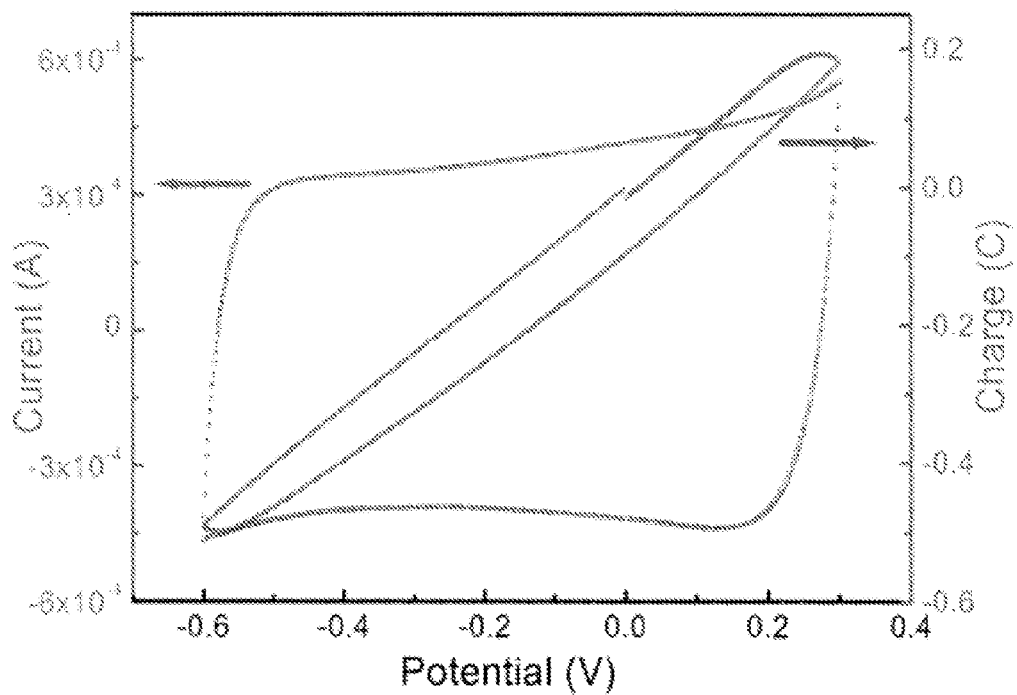

FIGS. 3A-3B show cyclovoltammograms obtained from activated carbon aerogels with different surface areas (FIG. 3A: 1900 m$^2$/g CA sample at a scan rate of 0.1 mV/s started from the open circuit potential (OCP) of 0.1 V); FIG. 3B: 2800 m$^2$/g CA sample at a scan rate of 0.5 mV/s). Note: The OCP was determined by the zero current chronopotentiometry. The capacitive double layer region was about 800 mV wide. The total charge build up may be calculated as 1.64 C. The mass of the sample was 23.8 mg. Therefore, the specific surface charge (considering the BET surface area=electrochemical active surface area)=3.62 μC/cm$^2$, and the specific double layer capacitance was typically in an order of 4-5 μF/cm$^2$.

Experiments showed that reversible changes of electrical resistance up to several 100% may be realized from centimeter-sized CA electrodes as described according to various embodiments herein. Changes in resistance of a CA working electrode while the electrochemical potential of the CA working electrode is periodically changed in an aqueous electrolyte are shown in FIGS. 4A-4C, according to various embodiments.

Figure 4A:
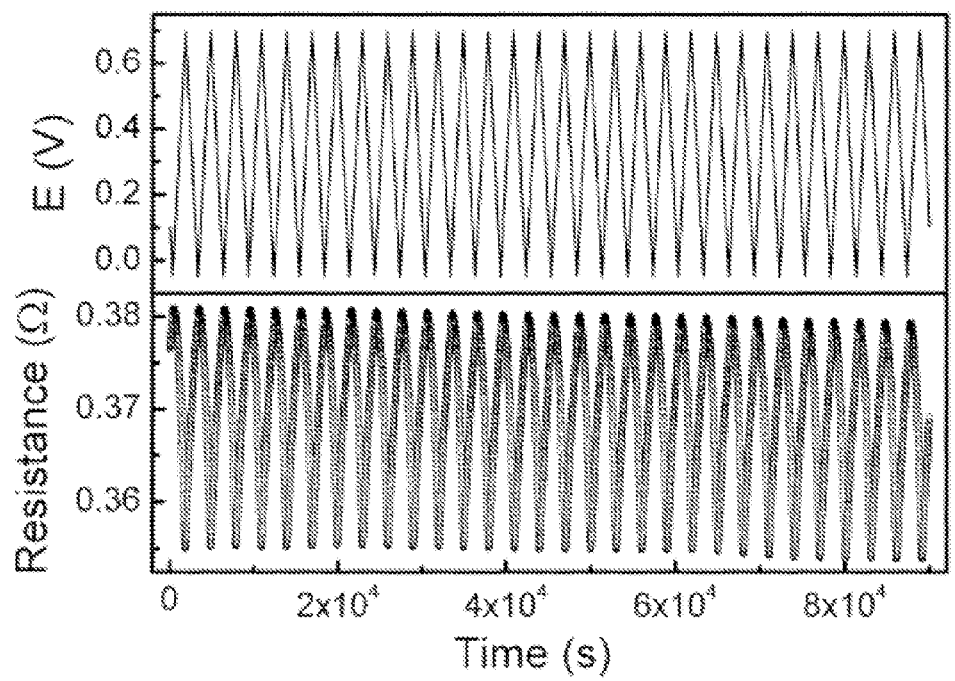
FIGS. 4A-4C show changes in resistance of a carbon aerogel working electrode while the electrochemical potential of the carbon aerogel working electrode is periodically changed in an aqueous electrolyte, according to various embodiments.
Figure 4B:
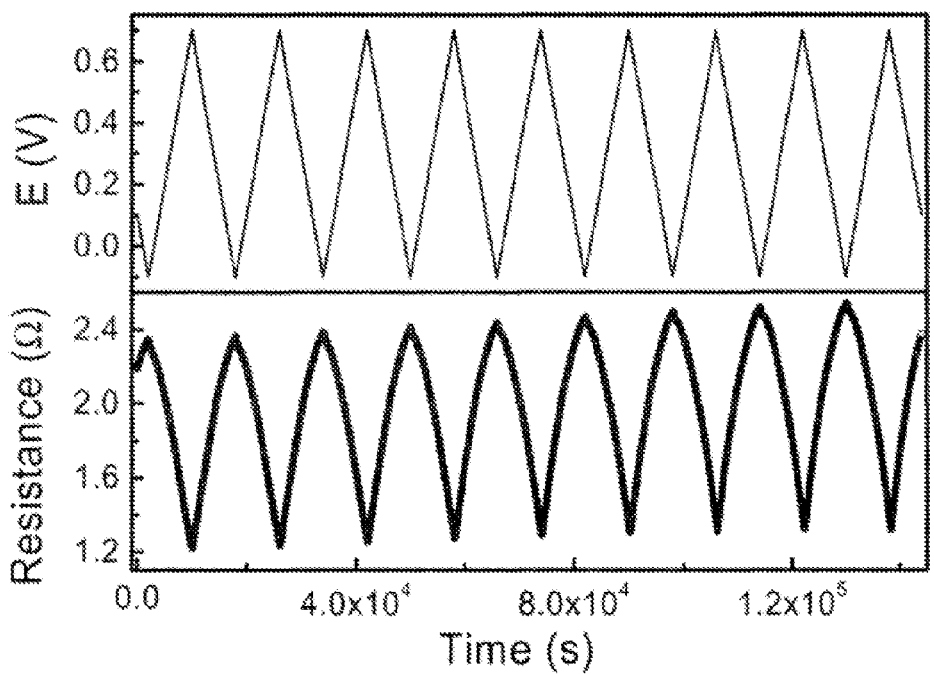

FIG. 4B shows surface charge induced variation in resistance of a CA working electrode with a surface area of 1900 m$^2$/g while the electrochemical potential of the CA working electrode was periodically changed between −100 and +700 mV as observed in FIG. 3A. Prior to the measurement, the samples were degassed inside the electrolyte in a vacuum desiccator for about 24 hours. Referring again to FIG. 4B, as can be seen, the reversible change in resistance (ΔR) is more than 100%.

Figure 4C:
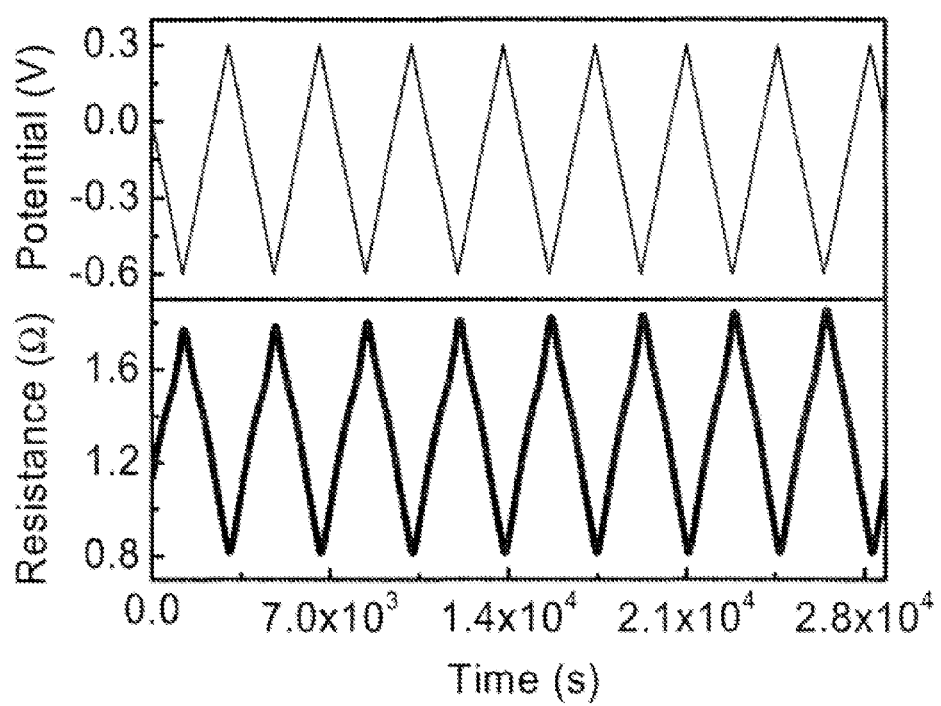

Similar results were observed for a 400 m$^2$/g CA sample while the electrochemical potential of the CA working electrode was periodically changed between −100 and +700 mV (as shown in FIG. 4A) and a 2800 m$^2$/g CA sample while the electrochemical potential of the CA working electrode was periodically changed between −600 and +300 mV (as shown in FIG. 4C). A small drift of the ΔR/R plot is observed in the later case (FIG. 4C), but this may be related to a small amount of irreversible surface adsorption.

It can be seen from FIGS. 4A-4C that an increase in resistance is observed when the voltage/bias that is applied to the CA with respect to the electrolyte becomes more negative. If the applied bias becomes sufficiently negative, a resistivity maximum (conductivity minima) may be observed. Such a conductivity maximum is expected if the Fermi level is at the Dirac point of the graphene constituent of the CA electrode. For more positive bias the material is predominantly an electron conductor, for more negative bias the material is predominantly a hole conductor (bipolar). Thus both holes and electrons may be responsible for the conductivity changes described above.

Undoped graphite has a carrier concentration of 2×10$^{19}$ cm$^{-3}$. The high conductivity is a result of extremely large in-plane mobility in graphite (13,000 cm$^2$/Vs). The Fermi level moves downward or upward depending on if the material is doped with holes or electrons, respectively. The material may be both unipolar and bipolar, depending on the applied potential range and the doping level. The double layer capacitance increases with carrier concentration which is higher in CAs (2×10$^{20}$ cm$^{-3}$) than in undoped graphite (2×10$^{19}$ cm$^{-3}$). Of course, other explanations are possible, and this theory is not meant to be limiting on the embodiments and approaches presented herein.

Figure 5A:
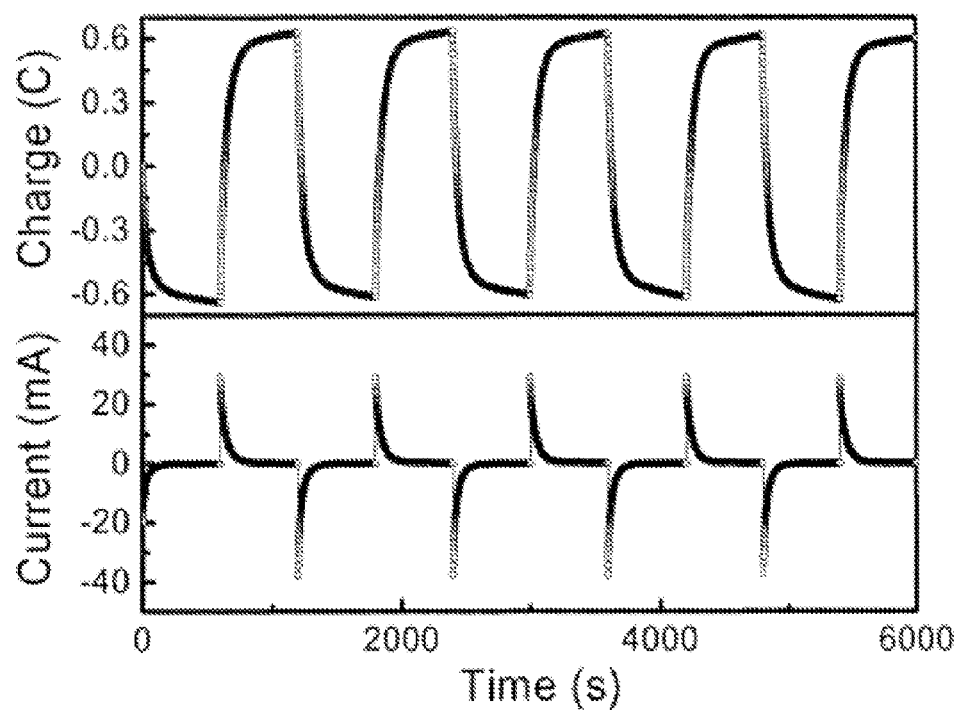
FIGS. 5A and 5B show pulse current charging and discharging of a carbon aerogel. over time, and the corresponding change in resistance, respectively.
Figure 5B:
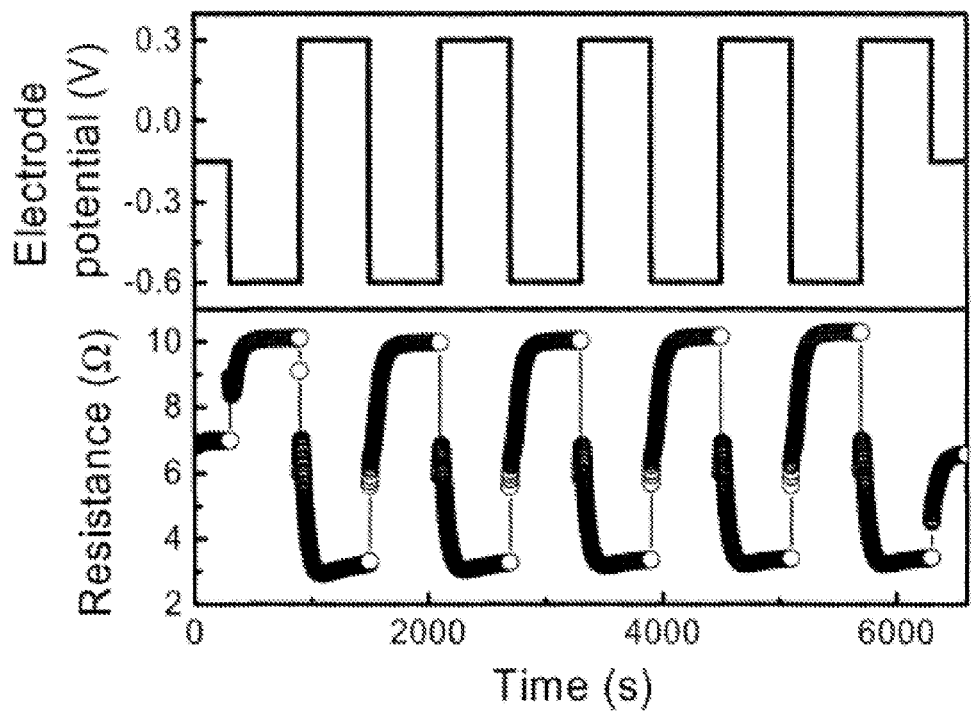

Now referring to FIGS. 5A-5B, a 1900 m$^2$/g CA sample in an aqueous electrolyte was subjected to pulse charging and discharging as shown in FIG. 5A, with corresponding change in resistance shown in FIG. 5B, according to one embodiment. FIG. 5A demonstrate that highly reproducible charging and discharging cycles are possible with nearly zero leakage current. Furthermore, the calculated surface charge density is 6 μC/cm$^2$ or 125 F/g. As shown in FIG. 5B, the charging and discharging time is of an order of a minute, which may be reduced by proper selection of the electrolyte and modification of the pore morphology, as would be apparent to one of skill in the art upon reading the present descriptions.

The reversible changes of electrical resistance may be further increased, for example, by introducing a band gap by controlled doping using any suitable material. According to various embodiments, nitrogen, oxygen, fluorine, boron, or any other element that modifies the electronic structure of the nanoporous carbon may be used to dope the CA. In one example, an n-type graphene-based field effect transistor device may be produced by nitrogen doping of graphene nanoribbons. Of course, any suitable doping material may be used, such as dopants commonly used in the semiconductor industry, as would be appreciated by one of skill in the art upon reading the present descriptions.

Figure 6A:
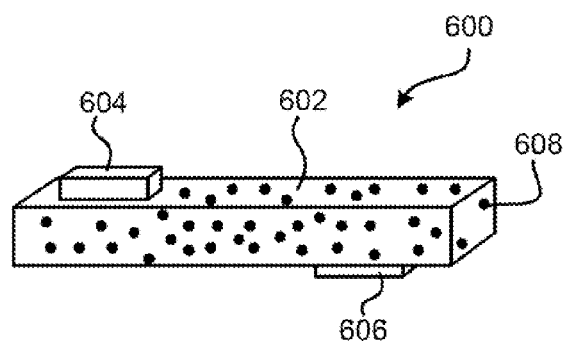
FIG. 6 shows a tunable resistor/transistor, according to one embodiment.
Figure 6B:
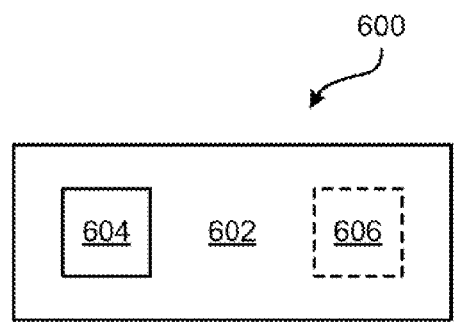
Figure 6C:
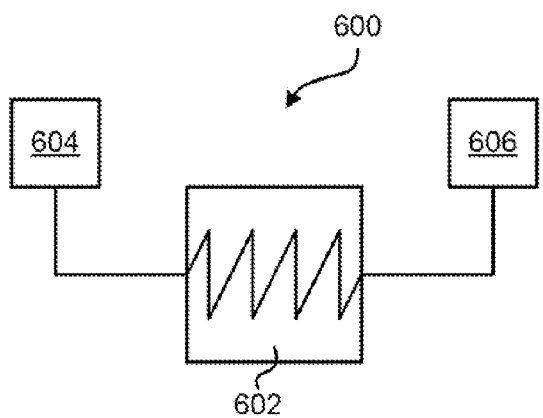

Now referring to FIGS. 6A-6C, a tunable resistor/transistor 600 is shown according to one embodiment. In FIG. 6A, an isometric view is shown of one embodiment of the tunable resistor/transistor 600. In FIG. 6B, a top view of the tunable resistor/transistor 600 is shown according to one embodiment. A simplified circuit diagram of the tunable resistor/transistor 600 is shown in FIG. 6C, according to one embodiment.

The tunable resistor/transistor comprises a porous material 602 that is contacted by a source electrode 604 and a drain electrode 606, and an electrolyte solution 608 saturating the porous material 602, the electrolyte solution 608 being adapted for altering an electrical resistance of the porous material 602 based on an applied electrochemical potential. The electrochemical gate is formed by charge accumulation of ions on the electrolyte side and electrons/holes on the solid side at the solid/electrolyte interface when a voltage is applied between the porous material 602 and a counter electrode. The porous material 602 comprises nanoporous carbon arranged in a three-dimensional structure. Here, the overall structure of the porous material 602 is shown as a polyhedron having a rectangular cross-section. However, any three-dimensional shape may be used, such as irregular shapes and/or regular shapes, like a sphere, pyramid, prism, spheroid, or any other shape as would be known to one of skill in the art or that suits the application for which the porous material 602 is intended.

Furthermore, each of the source electrode 604 and/or the drain electrode 606 may comprise any suitable material as would be known to one of skill in the art, such as active carbon, platinum, electrically conductive metals, alloys and/or polymers, etc. In addition, the source electrode 604 and/or the drain electrode 606 may have any shape suitable for use in the resistor/transistor and compatible with the shape of the porous material 602, as would be known to one of skill in the art.

Also, the orientation and positioning of each of the source electrode 604, drain electrode 606, and/or the porous material 602 may be altered as would be understood by one of skill in the art upon reading the present descriptions. For example, the source electrode 604 may be positioned opposite the drain electrode 606 on longitudinal ends of the porous material 602, they may be positioned on the same side of the porous material 602, they may be smaller or larger than one another, they may be connected to the porous material 602 using vias, wires, channels, or any other electrical connections, they may be positioned on a side and a top of the porous material 602, etc.

In one embodiment, the nanoporous carbon may comprise a carbon aerogel. The carbon aerogel may be procured through any method of production. In one exemplary embodiment, the carbon aerogel may be formed by polymerizing a sol-gel of resorcinol and formaldehyde (or any other suitable materials as known in the art) in an aqueous solution to produce an organic gel, supercritically drying the organic gel, pyrolizing the dried organic gel in an inert atmosphere and activating in carbon dioxide (or some other suitable gas as known in the art) at a temperature of greater than about 900° C. to form the carbon aerogel.

In another embodiment, the carbon aerogel may be doped with an element suitable for use in the semiconductor industry, such as nitrogen, oxygen, fluorine, boron, or any other suitable material as would be understood by one of skill in the art upon reading the present descriptions. Oxygen, nitrogen, and boron are readily available and much experience exists in using them as dopants.

In some approaches, the nanoporous carbon may have a surface area of greater than about 2800 $m^2/g$, preferably greater than about 3000 $m^2/g$, and even more preferably greater than about 3200 $m^2/g$, such as in a range from about 2500 $m^2/g$ to about 3500 $m^2/g$, according to various embodiments.

The electrolyte solution may be in a liquid, solid, or semi-solid form (such as a gel, extrusion, etc.), as would be understood by one of skill in the art. In some approaches, the electrolyte solution may be an aqueous electrolyte. Some examples of suitable aqueous electrolyte solutions include one or more of LiF, NaF, KF, KOH, KCl, $H_2SO_4$, $HClO_4$, $LiClO_4$, $NaClO_4$, $Et_4NPF_6$, $Et_4NBF_4$, $Bt_4NPF_6$, $Bt_4NBF_4$, etc. In other approaches, the electrolyte solution may be a nonaqueous electrolyte which is one or more electrolytes in a solvent. Some exemplary electrolytes suitable for use include one or more of LiF, NaF, $HClO_4$, $LiClO_4$, $NaClO_4$, $Et_4NPF_6$, $Et_4NBF_4$, $Bt_4NPF_6$, $Bt_4NBF_4$, etc. Some exemplary solvents suitable for use include one or more of acetonitrile, ethylene carbonate (EC), propylene carbonate (PC), dimethyl carbonate (DMC), ethyl acetate (EA), n-methyl formamide (NMF), dimethyl formamide (DMF), dimethyl sulfoxide (DMSO), etc. In alternate approaches, the electrolyte solution may be an ionic liquid. Some exemplary ionic liquids that may be used include one or more of 1-Ethyl-3-methylimidazolium tetrafluoroborate ($EMIMBF_4$), 1-Butyl-3-methylimidazolium hexafluorophosphate ($BMIMPF_6$), trioctylmethylammonium bis(trifluoromethyl-sulfonyl)imide, etc.

Figure 7:
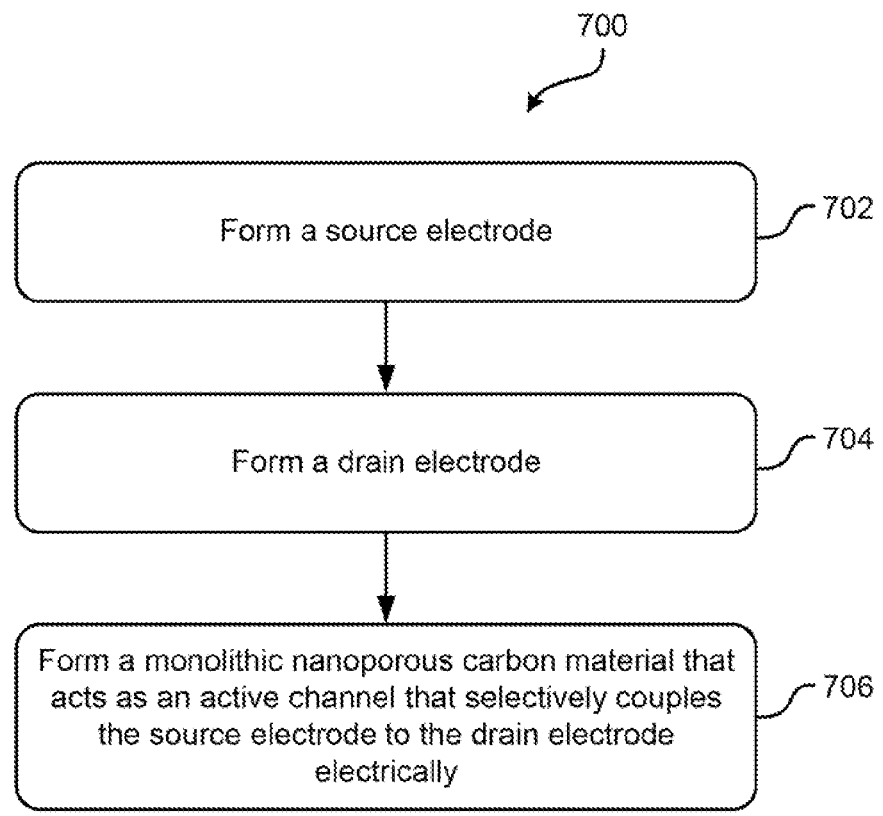
FIG. 7 is a flow diagram of a method according to one embodiment.

Now referring to FIG. 7, a method 700 for forming a tunable resistor/transistor is shown according to one embodiment. The method 700 may be carried out in any desired environment, including those shown and described in FIGS. 1-6C, according to various embodiments. Also, more or less operations than those specifically described in FIG. 7 may be included in method 700 in several approaches.

In operation 702, a source electrode is formed, such as above a substrate, in one approach. The source electrode may comprise any suitable material, such as active carbon, platinum, electrically conductive metals, alloys and/or polymers, etc.

Any suitable material may be used for the substrate, as would be known to one of skill in the art, such as silicon, silicon composites and alloys, oxides such as alumina, glass, etc.

In operation 704, a drain electrode is formed, such as above the substrate, in one approach. The drain electrode may comprise any suitable material, such as active carbon, platinum, electrically conductive metals, alloys and/or polymers, etc.

The source and drain electrodes may be formed in a single operation, simultaneously, using the same material or different materials, on different substrates, at different times, etc.

In operation 706, a monolithic nanoporous carbon material that acts as an active channel is formed, such as above the substrate, or one or more of the source and/or drain electrodes. The nanoporous carbon material selectively couples the source electrode to the drain electrode electrically. There may be a direct connection between the active channel and either or both of the drain electrode and/or source electrode, or any vias, wires, channels, or any other electrical connections may be used to form the connection.

In one embodiment, the nanoporous carbon material may comprise a carbon aerogel. The carbon aerogel may be formed as described herein using a sol-gel method or using any other suitable method as would be appreciated by one of skill in the art.

In one such embodiment, the carbon aerogel may be formed by polymerizing a sol-gel of resorcinol and formaldehyde (or some other suitable chemistry) in an aqueous solution to produce an organic gel, supercritically drying the organic gel, pyrolizing the dried organic gel in an inert atmosphere to form the carbon aerogel, and activating the carbon aerogel in carbon dioxide at a temperature of greater than about 900° C. to increase surface area of the carbon aerogel to above about 2000 m2/g.

In a further embodiment, the carbon aerogel may be doped with a suitable material, such as nitrogen, oxygen, fluorine, and/or boron.

In more approaches, the nanoporous carbon may have a surface area of greater than about 2800 $m^2/g$, preferably greater than about 3000 $m^2/g$, and even more preferably greater than about 3200 $m^2/g$, such as in a range from about 2500 $m^2/g$ to about 3500 $m^2/g$, according to various embodiments.

In one embodiment, the method 700 may further comprise applying an electrolyte to the nanoporous carbon active channel and altering an electrical resistance of the nanoporous carbon active channel based on an applied electrochemical potential of the electrolyte.

In further embodiments, the electrolyte may have physical characteristics as described herein and may comprise any suitable material, as described herein, according to various embodiments. For example, the electrolyte may be an aqueous electrolyte solution, a nonaqueous electrolyte solution, an ionic liquid, etc.

Figure 8:
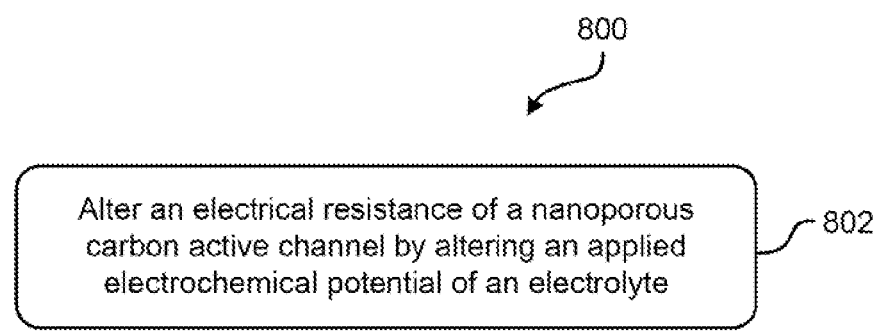
FIG. 8 is a flow diagram of a method according to one embodiment.

Now referring to FIG. 8, a method 800 for tuning a tunable resistor/transistor is shown according to one embodiment. The method 800 may be carried out in any desired environment, including those shown and described in FIGS. 1-6C, according to various embodiments. Also, more or less operations than those specifically described in FIG. 8 may be included in method 800 in several approaches.

In operation 802, an electrical resistance of a nanoporous carbon active channel is altered by altering an applied electrochemical potential of an electrolyte. The nanoporous carbon active channel may be saturated by the electrolyte in some approaches. However, any method of conveying electrical properties of the electrolyte to the nanoporous carbon active channel may be used as would be known to one of skill in the art.

In addition, the nanoporous carbon active channel is selectively coupled to a source electrode and a drain electrode electrically, in some embodiments, to form a tunable resistor/transistor.

In one approach, the nanoporous carbon may comprise a carbon aerogel doped with a suitable material, such as nitrogen, oxygen, fluorine, and/or boron. Of course, any other embodiments and/or approaches described herein may be used in the context of functionality of FIG. 8, in various implementations.

Illustrative applications of various embodiments include tunable resistors for high power DC applications, sensing, electrochemically controlled all-metal field effect transistors, use in low voltage high power electrical circuits, etc.

An additional advantage is that the various embodiments allow fabrication and/or use of bulk transistors/resistors, in contrast to the thin film technology of the semiconductor industry. Moreover, some embodiments may include all-carbon transistor/resistor technology, where the source and drain electrodes include carbon, as does the CA active channel.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A tunable transistor, comprising:
   a porous material that is electrically coupled between a source electrode and a drain electrode, wherein the porous material acts as an active channel;
   an electrolyte solution saturating the active channel, the electrolyte solution being adapted for altering an electrical resistance of the active channel based on an applied electrochemical potential,
   wherein the active channel comprises graphitic nanoporous carbon arranged in a three-dimensional structure, the graphitic nanoporous carbon having a surface area of greater than about 1900 $m^2/g$.

2. The tunable transistor as recited in claim 1, wherein the surface area of the graphitic nanoporous carbon is greater than about 2800 $m^2/g$.

3. The tunable transistor as recited in claim 1, wherein the electrolyte is at least one of:
   an aqueous electrolyte solution comprising at least one of: LiF, NaF, KF, KOH, KCl, $H_2SO_4$, $HClO_4$, $LiClO_4$, $NaClO_4$, $Et_4NPF_6$, $Et_4NBF_4$, $Bt_4NPF_6$, and $Bt_4NBF_4$,
   a nonaqueous electrolyte solution comprising an electrolyte in a solvent, wherein the electrolyte comprises at least one of: LiF, NaF, $HClO_4$, $LiClO_4$, $NaClO_4$, $Et_4NPF_6$, $Et_4NBF_4$, $Bt_4NPF_6$, and $Bt_4NBF_4$, and wherein the solvent comprises at least one of: acetonitrile, ethylene carbonate (EC), propylene carbonate (PC), dimethyl carbonate (DMC), ethyl acetate (EA), n-methyl formamide (NMF), dimethyl formamide (DMF), and dimethyl sulfoxide (DMSO), and
   an ionic liquid comprising at least one of: 1-Ethyl-3-methylimidazolium tetrafluoroborate ($EMIMBF_4$), 1-Butyl-3-methylimidazolium hexafluorophosphate ($BMIMPF_6$), and trioctylmethylammonium bis(trifluoromethyl-sulfonyl)imide.

4. The tunable transistor as recited in claim 1, further comprising a reference electrode and a counter electrode for applying the electrochemical potential to the electrolyte solution.

5. A tunable transistor, comprising:
   a porous material that is electrically coupled between a source electrode and a drain electrode, wherein the porous material acts as an active channel;
   an electrolyte solution saturating the active channel, the electrolyte solution being adapted for altering an electrical resistance of the active channel based on an applied electrochemical potential,
   wherein the active channel comprises nanoporous carbon arranged in a three-dimensional structure, and
   wherein the nanoporous carbon comprises a carbon aerogel.

6. The tunable transistor as recited in claim 5, wherein the carbon aerogel is doped with an element selected from a group consisting of: nitrogen, oxygen, fluorine, and boron.

7. A method for forming a tunable transistor, the method comprising:
   forming a source electrode;
   forming a drain electrode; and
   forming a monolithic nanoporous carbon material that acts as an active channel and selectively couples the source electrode to the drain electrode electrically,
   wherein the nanoporous carbon material is a carbon aerogel.

8. The method as recited in claim 7, further comprising:
   polymerizing a sol-gel of resorcinol and formaldehyde in an aqueous solution to produce an organic gel;
   supercritically drying the organic gel; and
   pyrolizing the dried organic gel in an inert atmosphere to form the carbon aerogel; and
   activating the carbon aerogel in carbon dioxide at a temperature of greater than about 900° C. to increase surface area of the carbon aerogel to above about 2000 $m^2/g$.

9. The method as recited in claim 7, wherein the carbon aerogel has a surface area of greater than about 2800 $m^2/g$.

10. The method as recited in claim 9, wherein the carbon aerogel is doped with an element selected from a group consisting of: nitrogen, oxygen, fluorine and boron.

11. The method as recited in claim 7, further comprising:
    applying an electrolyte to the nanoporous carbon active channel; and
    altering an electrical resistance of the nanoporous carbon active channel based on an applied electrochemical potential of the electrolyte.

12. The method as recited in claim 11, wherein the electrolyte is an aqueous electrolyte solution comprising at least one of: LiF, NaF, KF, KOH, KCl, $H_2SO_4$, $HClO_4$, $LiClO_4$, $NaClO_4$, $Et_4NPF_6$, $Et_4NBF_4$, $Bt_4NPF_6$, and $Bt_4NBF_4$.

13. The method as recited in claim 11, wherein the electrolyte is a nonaqueous electrolyte solution comprising an electrolyte in a solvent, wherein the electrolyte comprises at least one of: LiF, NaF, $HClO_4$, $LiClO_4$, $NaClO_4$, $Et_4NPF_6$, $Et_4NBF_4$, $Bt_4NPF_6$, and $Bt_4NBF_4$, and wherein the solvent comprises at least one of: acetonitrile, ethylene carbonate (EC), propylene carbonate (PC), dimethyl carbonate (DMC), ethyl acetate (EA), n-methyl formamide (NMF), dimethyl formamide (DMF), and dimethyl sulfoxide (DMSO).

14. The method as recited in claim 11, wherein the electrolyte is an ionic liquid comprising at least one of: 1-Ethyl-3-methylimidazolium tetrafluoroborate ($EMIMBF_4$), 1-Butyl-3-methylimidazolium hexafluorophosphate ($BMIMPF_6$), and trioctylmethylammonium bis(trifluoromethyl-sulfonyl) imide.

15. A method for tuning a tunable resistor/transistor, the method comprising:
    altering an electrical resistance of a nanoporous carbon active channel by altering an applied electrochemical potential of an electrolyte,
    wherein the electrolyte saturates the nanoporous carbon active channel,
    wherein the nanoporous carbon active channel comprises a carbon aerogel, and wherein the nanoporous carbon active channel is selectively coupled to a source electrode and a drain electrode electrically.

16. The method as recited in claim 15, wherein the nanoporous carbon active channel has a surface area of greater than about 2800 m$^2$/g.

17. The method as recited in claim 15, wherein the nanoporous carbon comprises a carbon aerogel doped with an element selected from a group consisting of: nitrogen, oxygen, fluorine, and boron.

18. The method as recited in claim 15, wherein the electrolyte is at least one of:
 an aqueous electrolyte solution comprising at least one of: LiF, NaF, KF, KOH, KCl, H$_2$SO$_4$, HClO$_4$, LiClO$_4$, NaClO$_4$, Et$_4$NPF$_6$, Et$_4$NBF$_4$, Bt$_4$NPF$_6$, and Bt$_4$NBF$_4$,
 a nonaqueous electrolyte solution comprising an electrolyte in a solvent, wherein the electrolyte comprises at least one of: LiF, NaF, HClO$_4$, LiClO$_4$, NaClO$_4$, Et$_4$NPF$_6$, Et$_4$NBF$_4$, Bt$_4$NPF$_6$, and Bt$_4$NBF$_4$, and wherein the solvent comprises at least one of: acetonitrile, ethylene carbonate (EC), propylene carbonate (PC), dimethyl carbonate (DMC), ethyl acetate (EA), n-methyl formamide (NMF), dimethyl formamide (DMF), and dimethyl sulfoxide (DMSO), and
 an ionic liquid comprising at least one of: 1-Ethyl-3-methylimidazolium tetrafluoroborate (EMIMBF$_4$), 1-Butyl-3-methylimidazolium hexafluorophosphate (BMIMPF$_6$), and trioctylmethylammonium bis(trifluoromethyl-sulfonyl)imide.

19. A tunable resistor/transistor, comprising:
 a nanoporous carbon active channel electrically coupled between a source electrode and a drain electrode, the nanoporous carbon active channel comprising a three-dimensional structure comprising a carbon aerogel; and
 an electrolyte solution saturating the nanoporous carbon active channel, the electrolyte solution being adapted for altering an electrical resistance of the nanoporous carbon active channel based on an applied electrochemical potential,
 wherein the carbon aerogel is doped with an element selected from a group consisting of: nitrogen, oxygen, fluorine, and boron,
 wherein the carbon aerogel has a surface area of greater than about 3000 m$^2$/g,
 wherein the electrolyte solution is an ionic liquid comprising at least one of: 1-Ethyl-3-methylimidazolium tetrafluoroborate (EMIMBF$_4$), 1-Butyl-3-methylimidazolium hexafluorophosphate (BMIMPF$_6$), and trioctylmethylammonium bis(trifluoromethyl-sulfonyl) imide or an aqueous or nonaqueous electrolyte solution comprising at least one of: LiF, NaF, KF, KOH, KCl, H$_2$SO$_4$, HClO$_4$, LiClO$_4$, NaClO$_4$, Et$_4$NPF$_6$, Et$_4$NBF$_4$, Bt$_4$NPF$_6$, and Bt$_4$NBF$_4$.

20. The tunable transistor as recited in claim 19, further comprising a reference electrode and a counter electrode for applying the electrochemical potential to the electrolyte solution.

* * * * *